United States Patent
Ohannes

(10) Patent No.: US 7,501,859 B1
(45) Date of Patent: Mar. 10, 2009

(54) DIFFERENTIAL SIGNALING SYSTEM WITH SIGNAL TRANSMISSION INTERRUPTION FOLLOWING ERROR DETECTION

(75) Inventor: James R. Ohannes, Cape Elizabeth, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/874,474

(22) Filed: Oct. 18, 2007

(51) Int. Cl.
*H03K 19/0175* (2006.01)

(52) U.S. Cl. .......................................... 326/82; 326/33

(58) Field of Classification Search ................... 326/82, 326/86, 16, 30–31, 33
See application file for complete search history.

(56) References Cited

U.S. PATENT DOCUMENTS

| | | | |
|---|---|---|---|
| 6,710,618 B1 * | 3/2004 | Murray | 326/30 |
| 6,724,234 B1 * | 4/2004 | Iliasevitch et al. | 327/378 |
| 6,879,534 B2 * | 4/2005 | Perner et al. | 365/209 |

* cited by examiner

*Primary Examiner*—James H Cho
(74) *Attorney, Agent, or Firm*—Vedder Price P.C.

(57) ABSTRACT

A differential signaling system in which errors in signal transmission or reception, or both, can be detected to allow signal transmission to be interrupted and thereby prevent further erroneous signal transmission or reception.

11 Claims, 2 Drawing Sheets

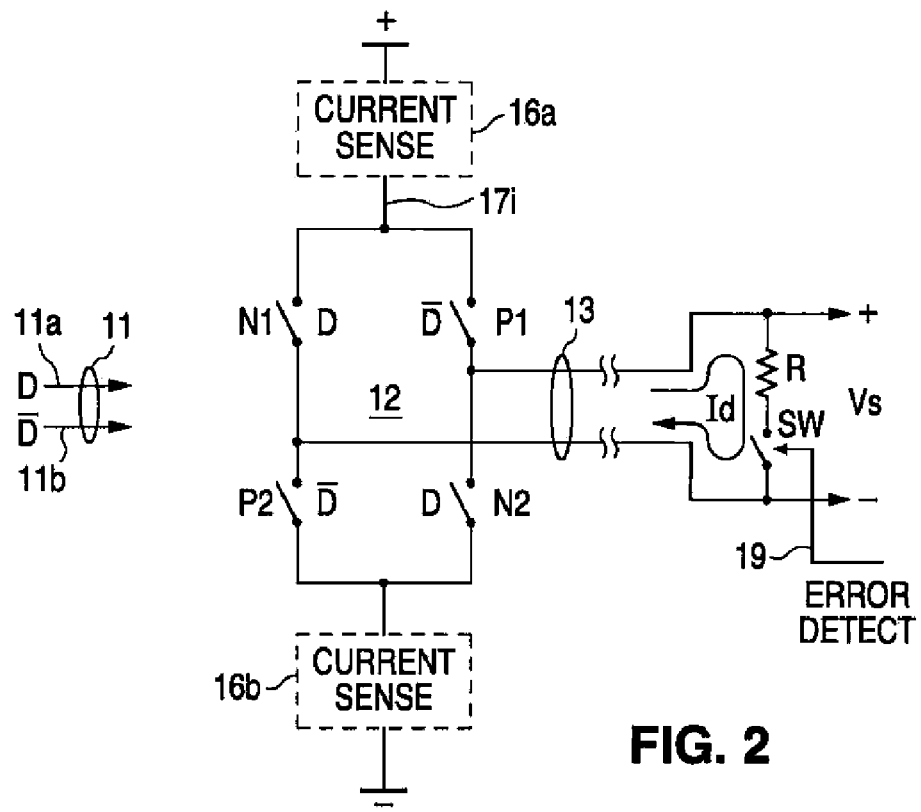
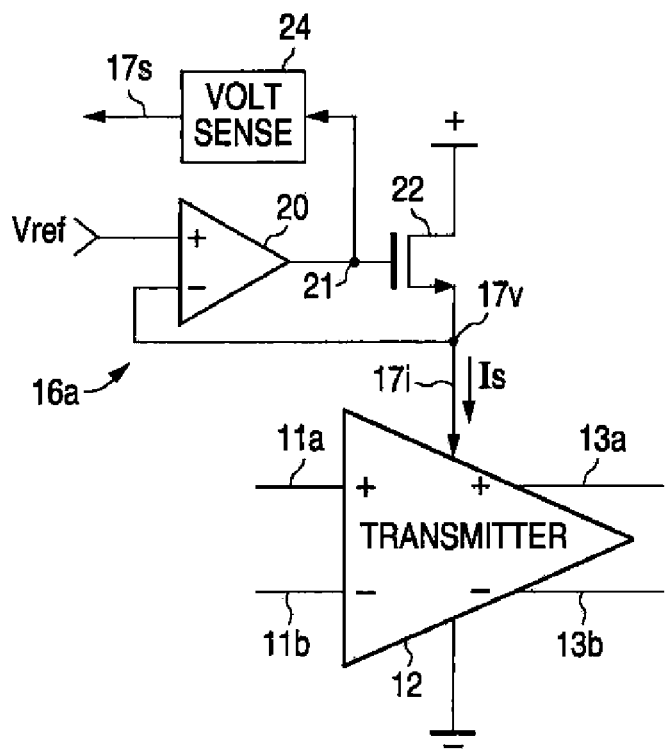
FIG. 2
FIG. 3

DIFFERENTIAL SIGNALING SYSTEM WITH SIGNAL TRANSMISSION INTERRUPTION FOLLOWING ERROR DETECTION

BACKGROUND OF THE INVENTION

1. Field of the Invention

The present invention relates to differential signal systems, and in particular to scalable low voltage signaling (SLVS) and low voltage differential signal (LVDS) systems.

2. Related Art

Differential input/output (I/O) signal interfaces are widely used for reliable high speed data transfer in many forms of data communication channels. They are used in both source synchronous and asynchronous communication systems. They can be used with bandwidth extension techniques, such as equalization and pre-emphasis. As is well known, differential signaling is preferred to single-ended signaling due to its highly robust resistance to common mode noise associated with both conducted and radiated electromagnetic interference (EMI), as well as lower power dissipation compared to single-ended static complementary metal oxide semiconductor (CMOS) implementations. Further, differential signaling also produces lower EMI emissions than their single-ended counterparts due to reduced signal magnitudes and switching currents.

During transmission of data across a differential signal link, errors can often occur, thereby causing the received data to be invalid. Following reception of such invalid data, the receiver will then need to somehow communicate back to the transmitter, e.g., by sending some form of error detection signal, to notify it of the erroneous data. In a bi-directional signal link, the signal is sent back via the interconnect through which the data was originally transmitted. However, the receiver cannot send this detection signal until the transmitter has finished sending its complete data payload and released control of the differential signal link. As a result, significant amounts of invalid data, or significant amounts of valid data following reception of invalid data, could be transmitted before the transmitter is notified of the error, thereby rendering the transmitted data useless until the error has been rectified or corrected data retransmitted.

SUMMARY

In accordance with the presently claimed invention, a differential signaling system is provided in which errors in signal transmission or reception, or both, can be detected to allow signal transmission to be interrupted and thereby prevent further erroneous signal transmission or reception.

In accordance with one embodiment of the presently claimed invention, a differential signal transmitter capable of providing a status signal indicative of a predetermined change in a differential signal current includes:

first and second signal electrodes to convey a differential signal current with at least lower and higher magnitudes;

current source and sense circuitry to provide a supply current with at least lower and higher magnitudes, sense the lower and higher supply current magnitudes, and provide a status signal indicative of the lower and higher supply current magnitudes; and differential signal transmission circuitry coupled to the current source and sense circuitry and the first and second signal electrodes to receive a first data signal and in response thereto draw the supply current and provide the differential signal current, wherein the lower and higher supply current magnitudes correspond to the lower and higher differential signal current magnitudes.

In accordance with another embodiment of the presently claimed invention, a differential signal receiver capable of substantially interrupting conduction of a differential signal current following detection of a signal reception error includes:

first and second signal electrodes to convey a differential signal current;

differential signal reception circuitry, coupled to and including a current path between the first and second signal electrodes, to receive a control signal having at least first and second substantially mutually exclusive signal states and in response thereto provide, during the first control signal state, the current path with a lower impedance and a data signal related to the differential signal current, and provide, during the second control signal state, the current path with a higher impedance; and signal processing circuitry coupled to the differential signal reception circuitry to process the data signal and in response thereto provide the control signal in the first control signal state when the processing of the data signal indicates a desired data signal status, and provide the control signal in the second control signal state when the processing of the data signal indicates an undesired data signal status.

In accordance with still another embodiment of the presently claimed invention, a method for transmitting a differential signal and providing a status signal indicative of a predetermined change in a differential signal current includes:

providing a supply current with at least lower and higher magnitudes;

sensing the lower and higher supply current magnitudes;

providing a status signal indicative of the lower and higher supply current magnitudes; and receiving a first data signal and in response thereto drawing the supply current and providing the differential signal current with at least lower and higher magnitudes, wherein the lower and higher supply current magnitudes correspond to the lower and higher differential signal current magnitudes.

BRIEF DESCRIPTION OF THE DRAWINGS

FIG. 2 is a functional block diagram of the transmitter of FIG. 1.

FIG. 3 is a functional block diagram of one example embodiment of the current sense circuitry of FIG. 2.

DETAILED DESCRIPTION

Figure 1:
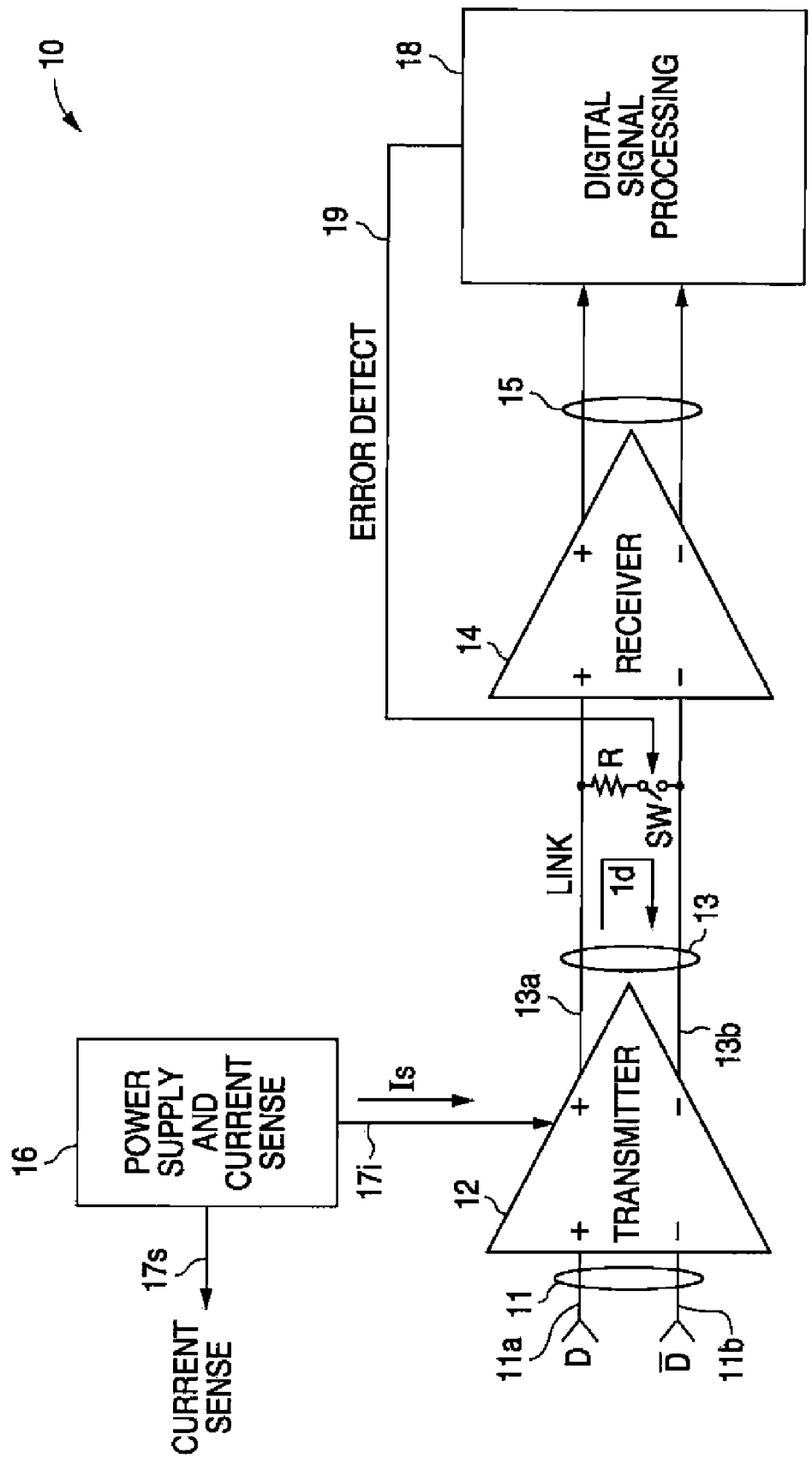
FIG. 1 is a functional block diagram of a differential signaling system in accordance with one embodiment of the presently claimed invention.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Referring to FIG. 1, a differential signaling system 10 in accordance with one embodiment of the presently claimed invention includes, at least in part, various combinations of transmitter circuitry 12, receiver circuitry 14, power supply and current sense circuitry 16, and digital signal processing circuitry 18, interconnected substantially as shown. In accordance with well known differential signaling techniques, a data signal 11, e.g., a differential data signal having positive 11a and negative 11b signal phases, is converted to a differential signal 13 for transmission via the signal link. As is well known, the signal 13 includes positive 13a and negative 13b signal phases which produce a differential link current Id conducted by a resistance R between the link electrodes to produce a signal voltage Vs across such resistance R.

In accordance with the presently claimed invention, included with this resistance R is a controllable switch Sw (e.g., in the form of a pass transistor or transmission gate). The receiver circuitry 14 senses this resulting signal voltage Vs and produces a data signal 15 in a format compatible for internal conveyance and processing within the host system for the receiver. This data signal 15 is processed by digital signal processing circuitry 18.

Further in accordance with the presently claimed invention, when an error in the received data signal 15 is detected within the digital signal processing circuitry 18, an error detect signal 19 is produced to control the switch Sw in the signal link at the front end of the receiver 14. When an error has been detected, the error detect signal 19 causes the switch Sw to open (i.e., transition from a lower impedance to a higher impedance), thereby effectively interrupting conduction of the link current Id.

The source current Is for the transmitter circuitry 12 is provided by the power supply and the current sense circuitry 16. This source current Is has a magnitude which is related (e.g., proportional) to the magnitude of the link current Id. Accordingly, when the link current Id is interrupted (e.g., substantially reduced in magnitude), the magnitude of the source current Is is similarly affected. This is sensed by the power supply and current sense circuitry 16 which, as a result, provides a current sense signal 17s indicative of this change in the source current Is and, by extension, the change in the link current Id. This indication by the current sense signal 17s (e.g., transitioning from a non-asserted signal state to an asserted signal state) of an error in data communication can be used by control circuitry elsewhere in the host system for the transmitter circuitry (e.g., processed in the protocol layer) to cause the previously transmitted data to be retransmitted, or other corrective action to be taken. (As should be readily understood, such an error in data communication can be in the form of either data transmission or reception, i.e., the data may have been transmitted erroneously by the transmitter circuitry 12, or somehow received or otherwise processed erroneously by the receiver circuitry 14. In either case, the digital signal processing circuitry 18 will detect the error, e.g., when performing an error test such as a cyclic redundancy check (CRC) process).

Referring to FIG. 2, in accordance with one example embodiment, the transmitter circuitry 12 includes a SLVS or LVDS circuit with switching transistors N1, P1, P2, N2, interconnected substantially as shown and biased between positive and negative power supply electrodes. As is well known, in the case of a SLVS circuit, the positive and negative power supply electrodes would be driven by voltage sources, while in the case of a LVDS circuit, the positive and negative power supply electrodes would be driven by current sources. (Additionally, one or more source termination resistances, e.g., a differential resistance or separate serial resistances, may be used as disclosed in commonly assigned U.S. patent application Ser. No. 11/753,163, the contents of which are incorporated herein by reference.) As is further well known, the switching transistors N1, P1, P2, N2 are often implemented as pass transistors with N1 and N2 being N-type MOS field effect transistors (MOSFETs) and Pt and P2 being P-type MOSFETs. However, as will also be readily understood, as an alternative, the switching transistors N1, P1, P2, N2 can be either all N-type or all P-type transistors. Further, as yet another alternative, each of the switching transistors N1, P1, P2, N2 can be implemented as a pair of complementary transistors, e.g., an N-type and P-type together, coupled in parallel in what is well known as a transmission gate. Transistors N1 and N2 are turned on by the positive phase 11a of the differential data signal while transistors P1 and P2 are turned on by the negative phase 11b of the differential data signal.

The source current 17i passes through current sense circuitry 16, which can be implemented as current sense circuitry 16a on the high, or more positive, side of the transmitter circuitry 12, or as current sense circuitry 16b on the lower, or more negative, side.

Referring to FIG. 3, in accordance with one example embodiment, current sense circuitry 16a for use on the high, or more positive, side of the transmitter circuitry 12 includes an operational amplifier 20 and an N-type MOSFET 22 connected as a voltage follower circuit and a voltage sensing circuit 24 (e.g., a voltage comparator). When the source current Is for the transmitter circuitry 12 decreases due to an interruption of the link current Id, as discussed above, the voltage 17v at the source electrode of the transistor 22 changes accordingly. This, in turn, causes the voltage 21 at the gate electrode of the transistor 22 to change in a like manner. The voltage sensing circuit 24, which monitors this voltage 21, detects this change and asserts the current sense signal 17s.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a differential signal transmitter capable of providing a status signal indicative of a predetermined change in a differential signal current, comprising:
   first and second signal electrodes to convey a differential signal current with at least lower and higher magnitudes;
   current source and sense circuitry to provide a supply current with at least lower and higher magnitudes, sense said lower and higher supply current magnitudes, and provide a status signal indicative of said lower and higher supply current magnitudes; and
   differential signal transmission circuitry coupled to said current source and sense circuitry and said first and second signal electrodes to receive a first data signal and in response thereto draw said supply current and provide said differential signal current, wherein said lower and higher supply current magnitudes correspond to said lower and higher differential signal current magnitudes.

2. The apparatus of claim 1, wherein said current source and sense circuitry comprises:
   current source circuitry to provide said supply current and a voltage with at least lower and higher magnitudes related to lower and higher supply current magnitudes; and
   voltage sensing circuitry coupled to said current source circuitry and responsive to said lower and higher voltage magnitudes by providing said status signal.

3. The apparatus of claim 1, wherein said differential signal transmission circuitry comprises scalable low voltage signaling circuitry.

4. The apparatus of claim 1, wherein said differential signal transmission circuitry comprises low voltage differential signal circuitry.

5. The apparatus of claim 1, further comprising:
   differential signal reception circuitry, coupled to and including a current path between said first and second signal electrodes, to receive a control signal having at least first and second substantially mutually exclusive signal states and in response thereto
      provide, during said first control signal state, said current path with a lower impedance and a second data signal related to said differential signal current, and
      provide, during said second control signal state, said current path with a higher impedance; and
   signal processing circuitry coupled to said differential signal reception circuitry to process said second data signal and in response thereto
      provide said control signal in said first control signal state when said processing of said second data signal indicates a desired data signal status, and provide said control signal in said second control signal state when said processing of said second data signal indicates an undesired data signal status.

6. The apparatus of claim 5, wherein said current path comprises a resistance and a switch serially coupled between said first and second signal electrodes, wherein said switch is responsive to said control signal by being closed and opened during said first and second control signal states, respectively.

7. An apparatus including a differential signal receiver capable of substantially interrupting conduction of a differential signal current following detection of a signal reception error, comprising:
   first and second signal electrodes to convey a differential signal current;
   differential signal reception circuitry, coupled to and including a current path between said first and second signal electrodes, to receive a control signal having at least first and second substantially mutually exclusive signal states and in response thereto
      provide, during said first control signal state, said current path with a lower impedance and a data signal related to said differential signal current, and
      provide, during said second control signal state, said current path with a higher impedance; and
   signal processing circuitry coupled to said differential signal reception circuitry to process said data signal and in response thereto
      provide said control signal in said first control signal state when said processing of said data signal indicates a desired data signal status, and
      provide said control signal in said second control signal state when said processing of said data signal indicates an undesired data signal status.

8. The apparatus of claim 7, wherein said current path comprises a resistance and a switch serially coupled between said first and second signal electrodes, wherein said switch is responsive to said control signal by being closed and opened during said first and second control signal states, respectively.

9. A method for transmitting a differential signal and providing a status signal indicative of a predetermined change in a differential signal current comprising:
   providing a supply current with at least lower and higher magnitudes;
   sensing said lower and higher supply current magnitudes;
   providing a status signal indicative of said lower and higher supply current magnitudes; and
   receiving a first data signal and in response thereto drawing said supply current and providing said differential signal current with at least lower and higher magnitudes, wherein said lower and higher supply current magnitudes correspond to said lower and higher differential signal current magnitudes.

10. The method of claim 9, further comprising:
    receiving a control signal having at least first and second substantially mutually exclusive signal states and in response thereto
       providing, during said first control signal state, a current path with a lower impedance for said differential signal current, and a data signal related to said differential signal current, and
       providing, during said second control signal state, said current path with a higher impedance for said differential signal current; and
    processing said data signal and in response thereto
       providing said control signal in said first control signal state when said processing of said data signal indicates a desired data signal status, and
       providing said control signal in said second control signal state when said processing of said data signal indicates an undesired data signal status.

11. The method of claim 10, wherein:
    said providing, during said first control signal state, a current path with a lower impedance for said differential signal current comprises closing a switch; and
    said providing, during said second control signal state, said current path with a higher impedance for said differential signal current comprises opening a switch.

* * * * *

UNITED STATES PATENT AND TRADEMARK OFFICE
CERTIFICATE OF CORRECTION

| | | |
|---|---|---|
| PATENT NO. | : 7,501,859 B1 | Page 1 of 1 |
| APPLICATION NO. | : 11/874474 | |
| DATED | : March 10, 2009 | |
| INVENTOR(S) | : James R. Ohannes | |

It is certified that error appears in the above-identified patent and that said Letters Patent is hereby corrected as shown below:

At Column 4, Line 21,
  please delete "Ser. No."

At Column 4, Line 25,
  after "transistors (MOSFETs) and" please delete "Pt" and insert --P1-- in its place At Column 5, in Claim 5, at Line 50,
  after "indicates a desired data signal status, and"
  please insert a line break and
  continue the next paragraph with "provide said control signal..."

Signed and Sealed this

Twenty-first Day of April, 2009

JOHN DOLL
*Acting Director of the United States Patent and Trademark Office*